US007842347B2

(12) United States Patent
Anderson et al.

(10) Patent No.: US 7,842,347 B2
(45) Date of Patent: Nov. 30, 2010

(54) INKJET PRINTING OF LAYERS

(75) Inventors: Frank Edward Anderson, Sadieville, KY (US); Jing X. Sun, Lexington, KY (US)

(73) Assignee: Lexmark International, Inc., Lexington, KY (US)

( * ) Notice: Subject to any disclaimer, the term of this patent is extended or adjusted under 35 U.S.C. 154(b) by 1157 days.

(21) Appl. No.: 11/148,610

(22) Filed: Jun. 9, 2005

(65) Prior Publication Data

US 2006/0279619 A1 Dec. 14, 2006

(51) Int. Cl.
*B05D 5/00* (2006.01)

(52) U.S. Cl. ...................................... 427/333

(58) Field of Classification Search ................ 427/402, 427/407.1, 301, 333
See application file for complete search history.

(56) References Cited

U.S. PATENT DOCUMENTS

| | | | |
|---|---|---|---|
| 6,503,831 B2 | 1/2003 | Speakman | |
| 6,646,024 B2 | 11/2003 | Beach et al. | |
| 6,652,634 B1 | 11/2003 | Akers, Jr. et al. | |
| 6,713,389 B2 | 3/2004 | Speakman | |

OTHER PUBLICATIONS

Calvert et al., "Multilayer Inkjet Printing of Biopolymers, OLED's and Other Devices," published 2000-2001.*
Paul Calvert, Ghassan Jabbour and Yoka Yoshioka, "Multilayer Inkjet Printing of Biopolymers OLED's and Other Devices," Undated (available 2000-2001), 5 pages by count, Publication: Unknown.

* cited by examiner

*Primary Examiner*—William Phillip Fletcher, III

(57) ABSTRACT

A layer of material that binds to the next material to be printed is applied. In an embodiment this material is a resin containing a porous silica. The number of printing passes and amount of liquid accumulation is reduced by selecting ingredients of the ink to act both as a humectant and as a layer former, which permits the ink to have high amounts of active ingredient. In an implementation, two materials, the first an ink depositing amine and the second an ink depositing epoxy, are printed separately. They react in situ to form a single, dielectric layer. When the lower layer is a conductive metal trace or a wiring crossover on, for example, a paper substrate, a second metal trace perpendicular to the lower trace may be formed on the dielectric layer to form a capacitive circuit configuration.

7 Claims, No Drawings

INKJET PRINTING OF LAYERS

TECHNICAL FIELD

This invention relates to the inkjet printing of distinct laminations of materials which are not conducive to simple application of inkjet ink. An embodiment is the printing of a dielectric layer over a metal conductive layer.

BACKGROUND OF THE INVENTION

Although a wide range of materials can be printed by inkjet printing, in practical applications the number of passes may be prohibitively high or the liquid applied may accumulate excessively. If a silver trace is applied, for example, by inkjet printing on paper, subsequent printing over that trace may find the next ink absorbed under the silver. Accordingly, printing a layer over the silver is not achieved by simply applying the subsequent printing.

An important implementation for such a second layer is to print a dielectric layer over a conductive layer of conductor, such as silver. A second conductive trace could be applied to that dielectric layer so as to form a capacitor. More generally, such laminations of conductors and insulators or dielectrics are used to address wiring requirements where signals cross.

Such applications are discussed in a prior art publication titled "Multilayer Inkjet Printing of Biopolymers, OLED's and Other Devices," authored by Paul Calvert, Glasson Jabber and Yuka Yoshioka, Department of Materials Science and Engineering and Optical Sciences Center, University of Arizona. It discusses applying a dielelectric layer by inkjet prints of epoxy polymerized after prints with amine. However, it does not address the foregoing practical problems of excessive printing passes, excessive liquid accumulation, and migration of the printing off the lower layer.

DISCLOSURE OF THE INVENTION

This invention controls migration by first applying a layer of material that covers a lower layer and that binds to the next material to be printed. This material has sufficiently low film forming temperature that it forms a thin film at room temperature over the lower layer. In an embodiment, the material is a resin having sufficient hydrophilic functionality to be dispersed in the ink and having film-forming ability to solidify after leaving the ink. As a binding ingredient, a porous, self-dispersed silica having active hydroxy sites is blended with the resin.

A separate layer is then formed by inkjet printing over the resin and silica layer. In an implementation, two materials, the first an ink depositing amine and the second an ink depositing epoxy, are printed separately. They react in situ to form a single, dielectric layer. Application of the alternating layers may be repeated two or more times.

When the lower layer is a conductive metal trace on, for example, a paper substrate, a second metal trace perpendicular to the lower trace may be formed on the dielectric layer to form a capacitive circuit configuration.

This invention reduces the number of printing passes and amount of liquid accumulation by selecting ingredients of the ink that permit the amount of material to be coated to a relatively high amount by weight of the weight of the ink. In an embodiment, this is done by selecting ingredients with sufficient water solubility to function as humectants in the ink and as coating materials when the ink is applied. (Humectants are materials which, when mixed with water, limit the volatility of the mixture as a whole.) In embodiments, the amine ink has no separate humectant and is at least 10 percent by weight, preferably about 20 percent by weight of the ink. A glycidyl ink preferably has some humectant and is at least 10 percent by weight, preferably about 20 percent by weight of a glycidyl material.

DESCRIPTION OF THE PREFERRED EMBODIMENTS

This invention will be described with particular reference to electrical circuitry.

Printing radio frequency identification (RFID) circuitry with inkjet printers has significant advantages in cost as each element made can be varied by control of the printing. In a typical RFID printing process, multiple layers of printing is required to form crossover wiring. For example, between layers of conductive silver, dielectric layers are necessary to insulate the connection. Silver dispersions used in such printing are known.

This invention makes possible the forming the dielectric layer between the silver layers by inkjet printing.

Printing RFID with inkjet printers is an interesting technical project. In a typical RFID printing process, multiple layers of printing is required. For example, between layers of conductive silver, dielectric layers are necessary to insulate the connection. Methods to make the silver dispersions for such printing, useful for RFID are known. This invention is directed to the method to forming the dielectric layer between the silver layers.

Many organic and polymer materials can be used as the dielectric material, as long as the material can provide a smooth film without pinholes, and the required water resistance, heat resistance and dielectric characteristics. In current inkjet technology, the ink viscosity, surface tension, and water solubility constitute limitations on printing laminations. In current inkjet technology, over 90% of the jetted inks are water and humectant, which are not the film-forming materials; therefore, the printing process is not efficient.

Although the foregoing article by Calvert et al. reported using aqueous soluble diglycidyl and amine as the two components for curing into epoxide dielectric layer, because of the foregoing properties, known inks are impractical.

Since epoxide has been a widely used dielectric material in the organic electronics, to find an efficient way of jetting the components and introducing the non-water soluble components into the formulation is very useful for RFID production. Generally there are two possible ways to make it by inkjet printing. One is printing only an emulsified epoxide polymer latex, but such a emulsion is not known which can be adequately found and controlled and jetted in large enough amounts. Another is to jet the two reactive monomers through two different printheads and let the polymer form on the media with heating. The second way, directing printing monomers, provides the opportunity to select the desired monomer to satisfy the film formation. This is also mentioned in the foregoing paper by Calvert et al.

In such printing, the monomers are small molecules, so it may be easier for them to penetrate into the recording medium and not form a film above the conductive layer. Also, because almost all the glycidyl ethers are water insoluble and have high viscosity, it is difficult to achieve reliability of printing operation by thermal ink jetting. The final printing layer's water resistance is another element to be considered. Nevertheless, printing monomers is employed beneficially by this invention to increase the weight percent of the reactive ingredient, therefore increasing the efficiency in ink jet printing.

Several key problems have been solved.

1. To prevent the organic molecules penetration, an ambient film forming acrylic latex binder containing the film forming monomer such as methyl methacrylate, butyl acrylate, styrene is printed over the first layer of the conductive trace. Because of its low temperature film forming ability and the hydrophobicity, printing over this layer became difficult. To prevent the future layer printing problem, in the acrylic latex, a porous silica material, such as SNOWTEX PS-M, ZL, from Nissan Chemicals Inc. is added. The porous silica in the latex prevents the beading up of the future layers printed over the latex and increases the adhesive ability of the latex with the future materials. Polyvinyl alcohol solution can also be used for this purpose as it similarly absorbs water.
2. Because of the application requirement, the water-soluble materials are not the good choice. However, the water insoluble materials are difficult to be used in the aqueous ink jet inks. Therefore, balancing the hydrophobic and hydrophilic monomer and introducing cross-linking agents are necessary.
3. Monomers are selected that act multi-functional, such as used as the humectant, so that the percent of the reactive ingredient can be reached to the highest in the formulation. This obviously can be seen in the formulation of the curing agent. Many di-functional or tri-functional amines contain polyethylene glycol, which is an excellent humectant in the thermal ink jet inks. Choosing these types of amines can eliminate the extra humectant in the ink. However, the water resistance of the film also needs to be considered. Therefore, choosing the polyethylene glycol-co-polypropylene glycol amines, such as JEFFAMINE D230, T403 from Huntsman, and the multi-amine/imine, such as CX-100 from NeoResins, will provide a balance. Polyethylene glycol diglycidyl ether probably is the only water-soluble glycidyl that can be found. Using it as the humectant definitely gives better print head reliability and high percent of reactive ingredient, but because it is not a cross-linker, in the place where has high requirement of water and solvent resistance, it needs to be carefully used. On the other hand, the emulsions of the bisphenol diglycidyl ethers have advantage for their water resistance.
4. It is preferred that the amine is printed first on to the latex/porous silica binder. It is well known that the multi-amine compounds have the ability to flocculate the silica colloids, which is a component in the latex blocking film. The interaction of the two components will help the adhesion between the blocking and the dielectric layer.
5. The glycidyl and the curing agents are separated, as by being in two printing cartridges, to prevent interaction between them before reaching the media. This requires two docking stations in the printer. Also, of course, two separate printers could be used, one for the curing agent and one for the glycidyl compounds.
6. Different ink has different viscosity, so adjusting the ink printing speed is also necessary.

As stated below, the ink and the printing process are designed in the following ways:

First, a mixture is printed of ambient curing acrylic latex and silica colloid on the silver layer. Because of its ambient cure property, the latex will form a thin layer of film over the silver, which will block the epoxide monomers from penetrating under the silver layer.

Over the acrylic latex and silica colloid layer is printed the ink with the di-functional or tri-functional, amine containing polyethylene glycol-co-polypropylene glycol groups (such as JEFFAMINE D230 or T403 from Huntsman)), and polypropyleneimine (PPI) (such as CX-100 from NeoResins). PPI is an industry used cross linker. No extra humectants are necessary in the amine formula.

It is well known that polyamines can significantly agglomerate the porous silica particles, which binds the polyamines to inhibit the further penetration of the monomers into the medium and increases the interaction with the two layers. The polyamines used in this ink have two purposes: one, to agglomerate the silica colloid, and two, to cure with the glycidyl groups with extensive cross-linking. Since the PPI has lower solubility in aqueous solutions and the printing reliability to the printhead is also not very good, a di or multi functional water-soluble amine is added to help its printability. Water-soluble multi-amines can also be added in the formulation for the same purposes mentioned above.

The third application contains amine curable glycidyl chemical compounds. It is rare to find water-soluble glycidyl chemicals and too much water-solubility is very detrimental in this application. But to be applicable in the thermal ink jet printing, water solubility or miscibility is necessary.

To reach the solubility or miscibility, several methods can be used. First, for the relatively lower viscosity glycidyls, such as glycerol diglycidyl ether, diglycidyl 1,2-cyclohexanedicarboxylate, N,N-diglycidyl-4-glycidyloxyaniline, N,N-diglycidylaniline, trimethylolpropane triglycidyl ether, neopentylglycol diglycidyl ether, 1,4 butanediol diglycidyl ether, 1,6 hexanediol diglycidyl ether, and the like, polyethylene glycol diglycidyl ether can be used as a co-reactive/humectant compound to help increase the water solubility and the quantity of the reactive ingredient.

Another method to increase the water miscibility of the glycidyls is to use large quantity of water-soluble and glycidyl soluble organic solvents. N-propanol and iso-propanol are effective solvents to be used. The weak point for these two methods is that polyethylene glycol diglycidyl may hurt the final product's water resistivity. The low boiling point of the alcohol co-solvent, although it helps the drying process on the media, may hurt the reliability and jettability of the printhead in the end.

Some glycidyls, such as bisphenol A and its derivative glycidyl ethers, have excellent properties but too high viscosity, usually 4000 cp at room temperature, and not soluble in the water. To introduce this kind of chemicals in the ink, which usually requires the ink viscosity at about 2-5 cp, emulsion method has to be used. Previous publications showed that non-ionic and amphipatic surfactants have some good ability to emulsify the epoxide. There are some reactive surfactants have also been used in the emulsions. Typically, the stability and the particle size of the emulsion are the major concern in the ink jet application. The particle size needs to be lower than 300 nm with reasonable stability. In this invention, a dispersant structure used as described in U.S. Pat. No. 6,652,634 B1 Akers et al. is employed to emulsify of the bisphenyl A diglycidyl ethers, modified to a lower acid number of 6 and to much higher molecular weights of Mw of 16597 and Mn of 4023 (i.e., weight average and number averages, respectively). (Although typically dispersants do not react in ink, in this ink the dispersant reacts with the glycidyls during curing when water is evaporated.) In the emulsion, the particle size can be controlled from 150 to 300 nm, with a viscosity of 3-6 cp and no separation for a month. The advantage of this method is many monomers can be used in the formulation and the monomers are not limited by their viscosity and solubility. But the use of extra humectant may be needed for consideration in ink formulations.

Catalyst for curing can also be added in the ink. One of the popular water-soluble catalyst used here is 2-methyl-imidazole.

Embodiments

Following are the examples of the ink formulations:

A single bind layer is disclosed, as the primary difference from such a state-of-the-art is the inclusion of the porous silica. Three alternative formulas are given for the curing inks and for glycidyl solution inks. Four alternative formulas are given for glycidyl emulsion inks. As illustrative of this invention, each of the curing inks may be employed with any one of the glycidyl inks. The mole ratio of the curing agent to glycidyl is between 1.3:1 to 1:1.3.

Acrylic Latex: Binder Layer

PEG 400 (polyethylene glycol), 3.75 g; 2-pyrrolidone, 3.75 g; polymeric dispersant (of the foregoing U.S. Pat. No. 6,652,634, Mn 9119 and Mn 2834), 0.5 g; latex binder (of U.S. Pat. No. 6,646,025 to Beach et al.), 4 g; SNOWTEX ZL (porous silica), 1 g; Balance DI water to 50 g.

Curing Inks
1. JEFFAMINE T-403 2.3 g; JEFFAMINE D230, 1.5 g; 2-methyl-imidazole 0.5 g; SURFANOL 465 surfactant 0.5 g; DI water 15 g.
2. CX-100 multi amine/imine 2.3 g; JEFFAMINE 230 1.5 g; 2-methyl-imidazole 0.5 g; SURFANOL 465 0.5 g; DI water 15 g.
3. CX-100 multi amine/imine 2.3 g; JEFFAMINE 511 1.5 g; 2-methyl-imidazole 0.5 g; SURFANOL 465 0.5 g; DI water 15 g.
4. CX-100 multi amine/imine 6.0 g; JEFFAMINE 511 2.64 g; 2-methyl-imidazole 1.0 g; isopropyl alcohol 1.0 g, DI water 16.9 g.

Glycidyl Ether Solution Inks:
1. Glycerol diglycidyl ether 2.48 g; polyethylene glycol diglycidyl ether 13 g; N,N-diglycidyl-4-glycidyloxyaniline 2.76 g; isopropyl alcohol 7 g, DI water 21 g.
2. Glycerol diglycidyl ether 2.75 g; PEG 400 3 g; 2-pyrrolidone 3 g, n-propyl alcohol 4 g; DI water 5 g.
3. Trimethylolpropane triglycidyl ether 2.72 g; PEG 400 3 g; 2-pyrrolidone 3 g; n-propyl alcohol 4 g; DI water 5 g.

Glycidyl Ether Emulsion Inks:

The emulsifier of these inks is the dispersant as discussed in the foregoing with respect to U.S. Pat. No. 6,652,634 as modified to an acid number of 6 and to much higher molecular weight of Mw 16597 and Mn 4023.
1. Bisphenyl A diglycidyl ether 5.6 g; trimethylolpropane triglycidyl ether 4.3 g; emulsifier 1.8 g; diethylene glycol 7 g; balance DI water to 60 g
2. Bisphenyl A diglycidyl ether 7.0 g; trimethylolpropane triglycidyl ether 4.0 g; emulsifier 1.5 g, diethylene glycol 7 g; balance DI water to 60 g.
3. Bisphenyl A diglycidyl ether 8.4 g; trimethylolpropane triglycidyl ether, 3.2 g; emulsifier 1.5 g; diethylene glycol 7 g; balance DI water to 60 g.
4. Bisphenyl A diglycidyl ether 7.5 g; trimethylolpropane triglycidyl ether 3.7 g; emulsifier 1.0 g; TRITON-100 nonylphenyl PEG surfactant from Aldrich 0.5 g, diethylene glycol 7 g, balance DI water to 60 g.

In an illustrative embodiment, the silver print is over printed by inkjet printing with two layers of acrylic latex binder. Then, one layer of the amine curing agent is the printed by inkjet printing in two passes. Then a layer of the glycidyl ink is printed by inkjet printing. This alternating printing glycidyl ether printing is repeated three times. The substrate is then dried in the oven for 1 hour. A second silver layer generally perpendicular or crossing the first silver layer is applied as discussed. The silver traces are tested electrically and found to be partially non-conductive across the epoxy layer formed as described (the partial conductivity established that full non-conductivity can readily be achieved by routine experiment for specific applications).

The number of repetitive passes of printing can be varied widely as needed. The foregoing is illustrative as a wide range of materials can function as described.

What is claimed is:

1. A method of printing laminations on a substrate by inkjet printing comprising applying a second layer over a first layer on said substrate, subsequently applying by inkjet a first ink layer having an active material to form a film over said second layer, said second layer having a binding characteristic with respect to said active material to hold said active material over said first layer, wherein said first layer is a conductive metal trace and said second layer is a film forming resin containing an acrylic latex binder and porous silica.

2. The method as in claim 1 in which said active material of said first ink layer is a material which polymerizes with another material or catalyzes the polymerization of another material, and also comprising the step of applying by inkjet a second ink layer over said first ink layer having an active material and said active material of said second ink layer is said another material which polymerizes with or polymerizes by catalysis of said active material of said first ink layer.

3. The method of claim 2 in which said active material of said first ink layer is a multifunctional amine and said active material of said second ink layer is a glycidyl.

4. The method of claim 3 in which said glycidyl is a mixture of emulsified multifunctional glycidyl ethers.

5. The method as in claim 2 in which said active material of said first ink layer is at least about 10 percent by weight of the weight of said first ink layer and said active material of said second ink layer is at least about 10 percent by weight of the weight of said second ink layer.

6. The method as in claim 5 in which said active material of said first ink layer is about 20 percent by weight of the weight of said first ink layer and said active material of said second ink layer is about 20 percent by weight of the weight of said second ink layer.

7. The method of claim 5 in which said glycidyl is a mixture of emulsified multifunctional glycidyl ethers.

* * * * *